United States Patent [19]
Luzzi

[11] Patent Number: 5,225,999
[45] Date of Patent: Jul. 6, 1993

[54] MAGNETIC ENVIRONMENT STABILIZATION FOR EFFECTIVE OPERATION OF MAGNETICALLY SENSITIVE INSTRUMENTS

[75] Inventor: David E. Luzzi, Wallingford, Pa.

[73] Assignee: The Trustees of the University of Pennsylvania, Philadelphia, Pa.

[21] Appl. No.: 596,072

[22] Filed: Oct. 11, 1990

Related U.S. Application Data

[63] Continuation-in-part of Ser. No. 549,365, Jul. 6, 1990, abandoned.

[51] Int. Cl.$^5$ .................... G06F 15/20; H01H 47/00
[52] U.S. Cl. ................ 364/571.01; 361/146; 364/480; 364/571.03
[58] Field of Search ............ 364/524, 525, 571.01, 364/571.02, 571.06, 579, 480, 481, 571.03; 361/143, 146; 33/356, 357

[56] References Cited

U.S. PATENT DOCUMENTS

| | | | |
|---|---|---|---|
| 2,979,641 | 4/1961 | Günthard et al. | 361/146 |
| 3,673,465 | 6/1972 | Tschopp | 361/146 |
| 3,801,877 | 4/1974 | Griese et al. | 361/146 |
| 4,058,782 | 11/1977 | Förster | 361/146 |
| 4,622,843 | 11/1986 | Hormel | 33/356 |
| 4,823,081 | 4/1989 | Geisler | 361/146 |
| 5,032,792 | 7/1991 | Wing et al. | 361/146 |
| 5,032,947 | 7/1991 | Li et al. | 361/143 |

OTHER PUBLICATIONS

"Computer-controlled Method For Removal of Stray Magnetic Fields", Buncick, M. C., Hubbell, H. H. Jr., et al., *Rev. Sci. Instrum*, vol. 54, No. 1, Jan., 1983.

"Application of AC Magnetic Field Compensation to a Scanning Electron Microscope", Gemperle, A. and Novak, J., *Instit. of Physics, Czech. Academy of Sci.* Jan. 1976.

"Resolving Power of an Electron Microscope Equipped With Automatic Compensation of Transverse AC Magnetic Fields", Gemperle, A. et al., *Instit. of Physics, Czech. Academy of Sciences*, Nov. 1973, pp. 518-520.

"A Versatile Apparatus For Neutralizing Stray Magnetic Fields of AC Origin", Hadley Gerald L., et al., *The Review of Scientific Instru.*, vol. 43, No. 3, Mar. 1972.

"A Servo System For Reducing Stray AC Magnetic Fields in an Iron-Free Environment", Hand, J. W., *Journal of Physics E: Scientific Instru.*, vol. 9, 1976.

"The Application of a Fluxgate Magnetometer to an Automatic Electronic Degaussing System", Grahm, R. L. et al., *Canadian Journal of Physics*, vol. 39, (1961).

"Design of a Room-Size Magnetic Shield", Patton, Robert J. et al., *Journal of Geophysical Research*, vol. 67, No. 3, Mar., 1962.

"The Fluxgate Magnetometer", Primdahl, F., *J. Phys. E: Sci. Instrum.*, vol. 12, 1979, Great Britain.

Experimental High-Resolution Electron Microscopy; (1981) Spencer, J. C. H., Clarendon, Press, Oxford, pp. 97-104.

*Primary Examiner*—Kevin J. Teska
*Attorney, Agent, or Firm*—Woodcock Washburn Kurtz Mackiewicz & Norris

[57] ABSTRACT

A system and method for neutralizing magnetic instabilities in an environment of a magnetically sensitive instrument without opposing the operation of the instrument is disclosed. A magnetometer is employed to detect the magnetic instabilities in the environment and provide signals indicative thereof to a feedback circuit. The feedback circuit drives a helmholtz coil that surrounds the instrument to produce a primary magnetic field that compensates for the detected magnetic instabilities. A microprocessor provides an offset value that is used to drive a solenoid located at the magnetometer probe to produce an offsetting field that cancels the effects of secondary magnetic fields produced by the instrument.

41 Claims, 3 Drawing Sheets

MAGNETIC ENVIRONMENT STABILIZATION FOR EFFECTIVE OPERATION OF MAGNETICALLY SENSITIVE INSTRUMENTS

This application is a continuation-in-part of U.S. patent application Ser. No. 549,365, filed Jul. 6, 1990, now abandoned.

FIELD OF THE INVENTION

The present invention relates generally to the field of magnetic field control and more particularly to the field of controlling the magnetic fields in the environment of a magnetically sensitive instrument.

BACKGROUND OF THE INVENTION

In order to achieve effective operational performance, sensitive instruments often require a stable operational environment. For instance, to achieve maximum resolution in a state-of-the-art high resolution transmission electron microscope (HREM), a stable environment must be available at the microscope site. Due to the charge state of the electron beam and the use of electromagnetic lenses and coils, the HREM is sensitive to fluctuations in its magnetic field environment especially in the area of the HREM's objective lens. A typical value for maximum allowable fluctuation in the ambient magnetic field environment is $\pm 1$ mGauss ($10^4$ Gauss = 1 Tesla = 1 Weber/m$^2$: Earth's magnetic field = 500 mGauss). Fluctuations should be minimized in order to perform maximum resolution imaging experiments with a HREM and other magnetically sensitive instruments.

In general, magnetic environments contain horizontal and vertical magnetic field components. With respect to a HREM, instabilities in these components can have the effect of causing an uncertainty in the location and angle of the electron beam with respect to the optic axis (induced beam tilt), or can cause undesirable modification of the lens focusing condition in the instrument. Therefore, magnetic environment instabilities may substantially degrade the performance of a HREM or other sensitive instrument, unless the magnetic environment is controlled.

A horizontally-oriented magnetic field (e.g. transverse to the optic axis) acts as a magnetic deflector and tends to induce a tilt of the electron beam. A stable field of this type may be corrected through the use of beam deflectors during the normal alignment procedure of the microscope. A vertically-oriented field acts as an electromagnetic lens over the entire length of the microscope column and modifies the vertical magnetic field inside a lens polepiece (e.g. equivalent to a modification of the focal length and therefore the focusing condition of the lens). In a stable magnetic environment, the presence of the field is automatically compensated by adjusting the focusing strength of each lens and manipulating the specimen height within the objective lens polepiece. However, it is not generally practical nor efficient to compensate for unstable magnetic environments by adjusting the focusing strength or by manipulating the specimen height.

Magnetic field instabilities pose a significant problem to the operational effectiveness of magnetically sensitive instruments, since in the minimum case they tend to introduce uncertainty in the operating parameters of the instrument, and in the worst case tend to prevent any reasonable results from being obtained. The present invention provides a convenient and economical solution to the problem. For the purpose of description focus will be on an unstable vertical magnetic field around a JEOL, Ltd. JEM4000EX HREM, although the solution is more generally applicable to horizontal instabilities and other sensitive instruments.

When the time period of a magnetic field component becomes relatively large (e.g. earth's field), it can be considered as a stable DC magnetic field. A stable DC magnetic field is not a concern because it is typically compensated for by the instrument's adjustment settings. In contrast, when a magnetic field component's period is larger than the operational period of the sensitive instrument, for instance, the exposure time for a single image taken by a HREM, but not large enough to be considered a stable DC field, it is defined as a slowly wandering DC magnetic field. A slowly wandering DC field component could arise, for example, from an electrically-powered railway running in the vicinity of the instrument and may significantly degrade instrument performance. An AC field is any magnetic field component whose period is equal to or shorter than the operational period of the instrument (e.g. single image exposure time of a HREM).

Magnetic fields which are generated by the instrument itself are another significant problem in providing the stability required for state-of-the-art magnetically sensitive instruments used in applications, such as, Transmission Electron Microscopy (TEM), Scanning Electron Microscopy (SEM), Electron Beam Microprobe Instrumentation, Electron Beam Lithography, High Spatial Resolution Auger Electron Spectroscopy (AES) and High Spatial Resolution Electron Energy Loss Spectroscopy (EELS). These instruments will be referred to as magnetically active instruments.

A magnetically sensitive instrument is located within a given magnetic environment. Such environment may contain slowly wandering DC magnetic field components and AC magnetic field components. These components may be oriented in a vertical or horizontal direction with respect to the magnetically sensitive instrument. The compensation system detects these magnetic components at the magnetically sensitive instrument and then generates equal and opposite magnetic field components to control the environment. When the magnetically sensitive instrument is a magnetically active instrument it generates magnetic field components during its operation. The controlled magnetic environment will be referred to as the primary magnetic field. The magnetic field components generated by the instrument are secondary magnetic field components. The components detected at the instrument will be referred to as the detected magnetic field.

One solution to stabilize the magnetic environment at the sensitive instrument is to use magnetic shielding to reduce the effect of an unstable magnetic environment for measurements of low-level magnetic fields. *Patton and Fitch* (1962). This type of solution is not generally effective due to inherent difficulties such as the size of the instrument, convenience for instrument maintenance, and removal of instrument generated ambient heat.

Others have ventured to solve these problems by using a detection means to determine the magnetic field components in the magnetic environment at the site of the instrument and then provide neutralizing magnetic fields through an electromagnetic compensation coil. Several variations on this approach have been attempted in connection with other magnetically sensitive instrument installations. However, these attempts did not provide the level of performance that is required in order to perform high resolution electron microscopy. While operation of many state-of-the-art sensitive instruments including the HREM require stabilization of better than 1 mGauss, Gemperle and Novak (1976) and Gemperle et al. (1974) disclose compensation systems only providing stabilization to within 3 mGauss and Hadley et al. (1971) discloses a compensation system only capable of stabilizing the magnetic environment to between 1-2 mGauss. Furthermore, these compensation techniques and others could not compensate for both slowly wandering DC and AC magnetic field components. For instance, Buncick (1982), provided a compensation system with a very slow response time only capable of stabilizing DC magnetic field components. Whereas, Gemperle and Novak (1976), Gemperle, et al. (1974), and Hadley, et al. (1971) developed compensation systems only capable of detecting the AC magnetic field component and therefore, only compensated for AC magnetic fields. Compensation for both AC and DC magnetic field instabilities was provided by Hand (1976) but such result was accomplished only by simultaneously using two compensation systems.

Additionally, none of the prior art compensation systems can provide compensation for effective operation of magnetically active instruments. The magnetic fields generated by the instrument itself during its operation are problematic for compensation systems in the prior art because these systems would neutralize these field components thereby opposing fields created by the instrument necessary for its operation. For example, during operation of a HREM, the user changes the lens currents to maximize HREM focussing. Such changes in the HREM's electromagnetic lenses would be detected together with the components detected by the compensation system. For effective use of the HREM it is undesirable to have the compensation system opposing the focussing of the lenses.

Since a vertically oriented field will often require stabilization over the entire length of the instrument, practical restraints on the size and orientation will often be imposed on the coil. For example, a vertical magnetic field component acts as an electromagnetic lens over the entire length of a HREM column. Since the instrument is likely to be located in a laboratory of fixed size, certain electromagnetic coil orientations are more practical than others. One method to produce a uniform vertical magnetic field in a room is to construct a solenoid with length much greater than its diameter. This solution renders the room inaccessible from a human engineering standpoint. A single horizontal coil can also produce a vertical magnetic field at its center. This approach suffers from the necessity to locate the coil such that the objective lens polepiece is centered and in the plane of the coil, again raising human engineering concerns. A single coil located out of the objective lens horizontal plane requires a significantly larger current in order to accurately compensate for the ambient magnetic fields so that the coil will induce a large Vertical magnetic field gradient along the microscope column.

A system which overcomes all the problems associated with the prior art by providing compensation to both DC and AC magnetic field components while not interfering with secondary field components generated by a magnetically active instrument, must also fulfill practical constraints such as size and energy requirements.

SUMMARY OF THE INVENTION

The present invention overcomes the problems in the prior art by providing systems and methods for controlling the magnetic environment around a magnetically sensitive instrument including magnetically active instruments. More specifically, the claimed systems and methods provide control to both slowly wandering DC and AC magnetic field components which significantly degrade the operational performance of the instrument.

The compensation system comprises an electromagnetic coil means, a feedback means, and an offset means. The electromagnetic coil means substantially surrounds the instrument and produces at least one primary magnetic field around the instrument in response to magnetic instabilities detected in the environment of the instrument. The feedback means has an input for receiving signals indicative of the detected instabilities and an output coupled to the electromagnetic coil means for controlling the magnitude of the primary magnetic field produced thereby in response to the detected instabilities. The offset means is operatively interfaced with the instrument for producing an offsetting magnetic field for substantially neutralizing secondary magnetic fields produced by the instrument. The offset means renders the detected magnetic instabilities substantially free of any secondary magnetic field effects, so that the feedback means controls the magnitude of the primary magnetic field substantially free of effects of the secondary magnetic field.

The compensation system may further comprise a processing means having an input for receiving data indicative of the detected instabilities. The processing means integrates the received data to provide statistically error free signals, which it provides as an output coupled to the feedback means for producing the statistically error free signals. The processing means also monitors the input data and provides an output to a warning means for informing a user of the instrument of a characteristic of the primary magnetic environment. The processing means has another input for receiving data indicative of a characteristic of the secondary magnetic fields and an output coupled to the offset means for providing, based on the input data, an offset value for controlling the offsetting magnetic field. The offset value has a magnitude indicative of a correction to be made to the offsetting magnetic field.

An alternative embodiment is also provided where the processing means has an input for receiving detected instabilities and secondary magnetic fields combined. The processing means integrates this input data to provide statistically error free signals used in calculating the offset value. The processing means may then be instructed to freeze the offset value at its current value so that the offsetting magnetic field is maintained at its current magnitude and direction. Simultaneously, the processing means provides an output of statistically error free signals to the feedback means. After a determined period of time, or at the discretion of the user, the processing means breaks the interface between the processing means and feedback means and recalculates the offset value based on the statistically error free signals. The processing means then continues to provide the offset value to the offset means.

These and other advantages are accomplished by this invention which is particularly pointed out in the appended claims and is described and illustrated in connection with the accompanying drawings of preferred embodiments thereof.

BRIEF DESCRIPTION OF THE DRAWINGS

The present invention will be better understood and its numerous advantages will become apparent by references to the following detailed description of the invention when taken in conjunction with the following drawings; in which.

DETAILED DESCRIPTION OF THE DRAWINGS

Figure 1:
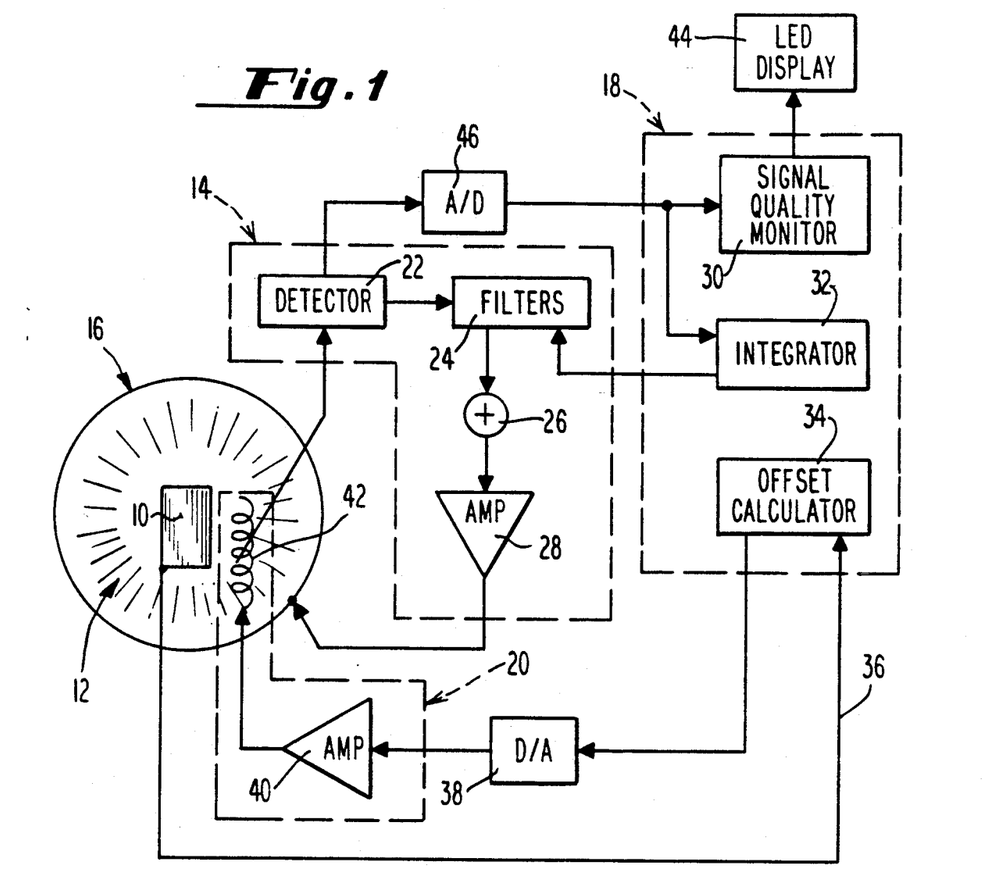
FIG. 1 is a block diagram of a magnetic compensation system for controlling the magnetic environment.

Referring to the drawings shown, like reference numbers refer to like elements. A new and novel system for controlling the magnetic environment around a magnetically sensitive instrument is shown in FIG. 1. In preferred embodiments, the system includes a feedback means 14 and an electromagnetic compensation coil 16. Both the feedback means 14 and electromagnetic compensation coil 16 preferably interface with the magnetic environment 12 at the magnetically sensitive instrument 10.

A preferred embodiment of the compensation system is used to control the magnetic environment around a magnetically sensitive instrument 10, which is more preferably a magnetically active instrument. In addition to the feedback means 14 and the electromagnetic compensation coil 16, a processor 18 and an electromagnetic offset 20 may be incorporated in the system.

One component of the magnetic environment at the magnetically active instrument 10 is the DC magnetic field produced by the instrument itself. For instance, during operation of a HREM, the user changes the lens currents to maximize HREM focussing. Such changes in the HREM's electromagnetic lenses would cause the compensation system to oppose the new field. For effective use of the HREM it is undesirable to have the feedback loop opposing the focussing of the lenses. In preferred embodiments of the system provided in accordance with the present invention, the processor 18 and electromagnetic offset 20 provide cancellation of the secondary electromagnetic field components by generating an offsetting magnetic field.

In the embodiment shown in FIG. 1, the processor 18 monitors the control settings of the magnetically active instrument and uses these values to determine the appropriate offset to the secondary magnetic field components. In further preferred embodiments, processor 18 calculates offset value by use of look-up tables or polynomial equations. The offset value is indicative of a power level required to change the magnitude of the offsetting magnetic field so that the secondary magnetic fields are cancelled. Although other means could be used to monitor the control settings and calculate the required offset, this is a preferred method because it allows the compensation system to function independently from the user of the magnetically active instrument. Once the appropriate offset is calculated, processor 18 outputs the offset value to the electromagnetic offset 20.

A preferred embodiment of the electromagnetic offset circuit is shown in FIG. 1 for use with the HREM. Any appropriate microprocessor may be used to fulfill this task. In a preferred embodiment, an AT&T Model 6312, IBM-AT compatible personal computer may be used. An RS232C Synchronous computer interface 36 continuously reads the lens currents of the HREM. D/A converter 38 interfaces the processor 18 to the bipolar operational power supply/amplifier 40. In a preferred embodiment, the bipolar operational amplifier 40 is a Burr-Brown 3553 AM. The bipolar operational power amplifier 40 is coupled to solenoid 42. Solenoid 42 provides cancellation to the secondary magnetic field at the magnetic environment 12, around the detector 22.

In preferred embodiments, microprocessor 18 or a different processor may be used to integrate the detected magnetic field components to provide a good statistical sampling of the slowly wandering DC magnetic field.

In a further preferred embodiment processor 18 also monitors the signal quality of the detected magnetic field components. A detection device 22 detects the slowly wandering DC and AC magnetic field components at the instrument 10 and outputs these field components to microprocessor 18 via the A/D converter 46 for signal quality monitoring. A diagnostic system may be interfaced with processor 18 to warn the user of characteristics of the magnetic environment. For instance, an LED display 44 may be used to indicate the signal strengths, field components which are present in the magnetic environment or compensation errors resulting from the present invention. Although a second processor, or even a signal level detection circuit known to those skilled in the art could be used for signal monitoring, it is preferable to use a single processor 18, to perform the offset calculation, signal monitoring and integration to minimize cost and system complexity.

The feedback means 14 preferably comprises a detector, filters, and a power amplifier. A detection device 22 detects slowly wandering DC and AC magnetic field components in the magnetic environment of the instrument. When both DC and AC magnetic field components require control, a preferred detection device 22 is a fluxgate magnetometer. In a more preferable embodiment, the magnetometer is a MacIntyre Electronic Design Associates Model Micro-Mag Fluxgate Magnetometer. However, when the magnetic field components requiring stabilization are AC components a simpler solution is to use a pick-up coil for detection.

The filters 24 preferably comprise tuned preamplifiers used to filter and amplify the detected DC and AC magnetic field components which have been determined to degrade the performance of the magnetically sensitive instrument 10. The frequencies upon which the pre-amplifiers should be tuned and the number of pre-amplifiers needed is best described by example. The following example is based upon a magnetic environment represented graphically in FIG. 2 and a HREM requiring magnetic field stability to within 1 mGauss.

Figure 2:
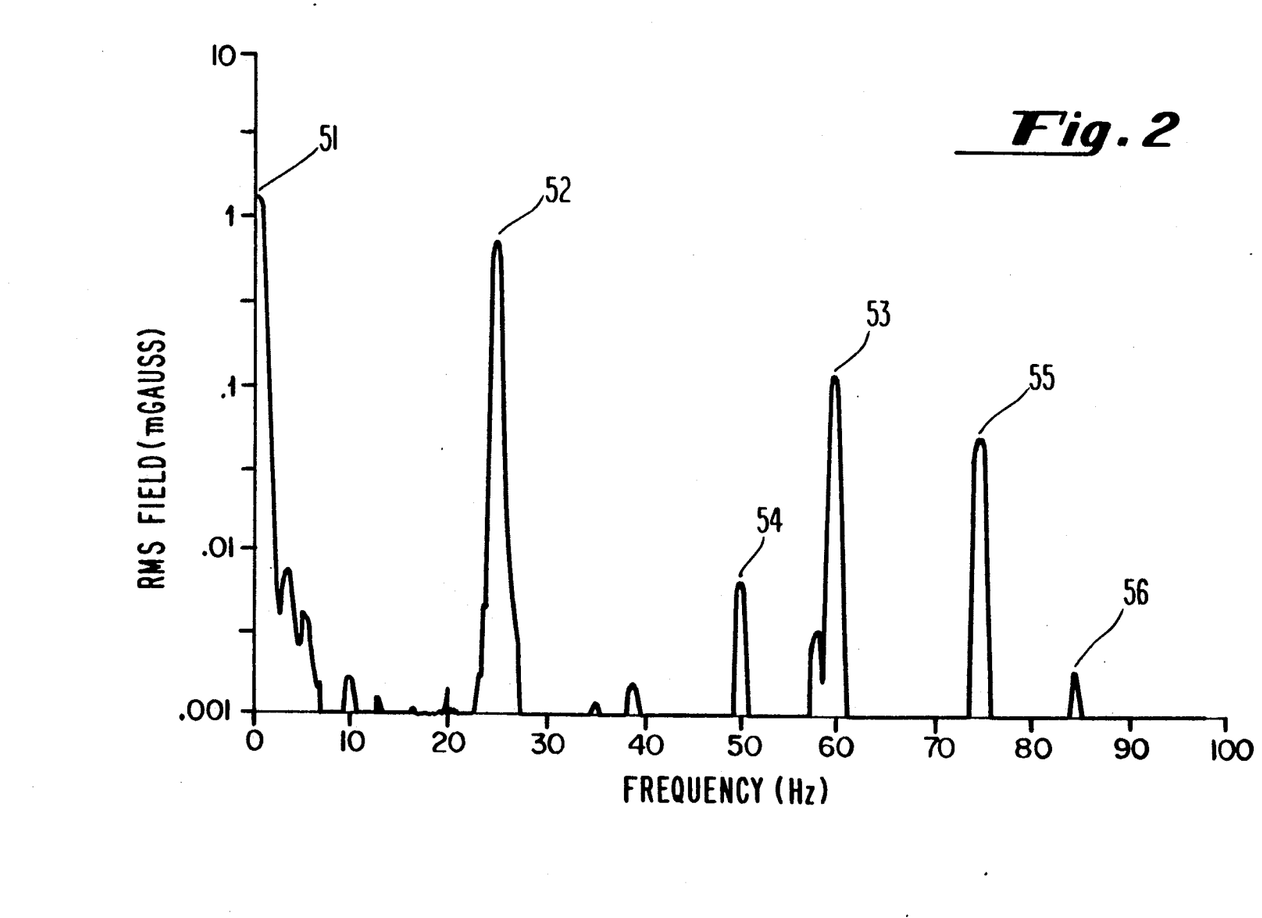
FIG. 2 is an example of magnetic field components in a magnetic environment requiring control.

The rms magnetic field strength is plotted on a logarithmic scale as a function of frequency in FIG. 2. The DC field can be seen centered around the left edge of the Figure at 51. In addition to the DC field, two major AC field components can be seen at 52 and 53. In a typical environment, these components have frequencies of 25 and 60 Hz. Other frequency components which arise as a result of these fields, most notably the 25 Hz field harmonics at 50 Hz and 75 Hz and the 85 Hz summed component of the 25 and 60 Hz fields may be present in the environment at 54, 55, and 56 respectively. Although all of these fields could contribute to establishing an envelope of resolution in the instrument, it is important to consider the strengths of each component. The AC magnetic environment is dominated by the 25 Hz signal 52 with a rms strength of 0.83 mGauss within this particular 4 sec sampling window of the instrument. The 60 Hz field 53 shows a rms strength of 0.14 mGauss which is well within the instrument tolerance. Since the HREM requires stabilization within 1 mGauss, only the DC component 51 and the 25 Hz AC component 52 require control.

Although one pre-amplifier could be used to amplify both DC and AC components, a single amplifier equipped with a low pass filter will induce a phase delay in the 25 Hz AC component 52. With such phase delay control of the AC magnetic field would generally require additional circuitry to synchronize the phase of the primary AC component and the detected AC component. Such a solution would become even more complex as the number of AC fields requiring control increased. Therefore, two tuned pre-amplifiers are preferred for the magnetic environment of FIG. 2, one to amplify the DC component 51 and the other to amplify the 25 Hz AC component 52. The tuned pre-amplifier for amplifying the DC component is preferably a Princeton Applied Research - Model 113 and the tuned pre-amplifier for amplifying the 25 Hz AC component is a Princeton Applied Research - Model 110. Bipolar power amplifier 28 is provided at the output of an adder circuit 26 which adds the outputs from the tuned preamplifiers and determines the power required to generate a current drive supplied to the electromagnetic compensation coil 16 for generating the primary magnetic field.

Figure 3:
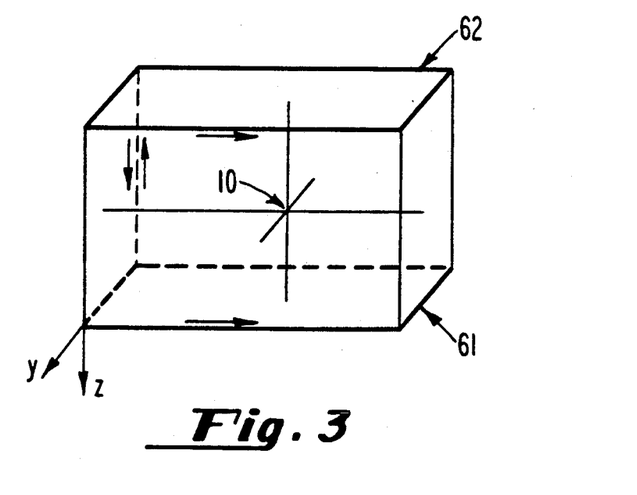
FIG. 3 is a diagram of a preferred electromagnetic coil orientation.

The orientation and specific configuration of the electromagnetic coil 16 is dependent upon the magnetic environment and the magnetically sensitive instrument. A preferred electromagnetic coil 16 comprises a pseudo-Helmholtz coil for the HREM example given the magnetic environment in FIG. 2. Referring to FIG. 3, one coil loop consisting of 20 turns is secured at the floor of the laboratory 61, while a second coil of 20 turns is secured at the ceiling of the laboratory 62. In this way the instrument is encompassed within the width of the coil. The width of the coil being defined as a length across the opening of the coil (e.g., for a circular coil the width is equivalent to its diameter, for a rectangular coil the width is equivalent to the distance between opposite sides). Although other single coil configurations and orientations could be used, this is a preferable coil because it does not render the room inaccessible, provides magnetic control over the entire length of the instrument and requires less energy than other coil configurations and orientations.

Figure 4:
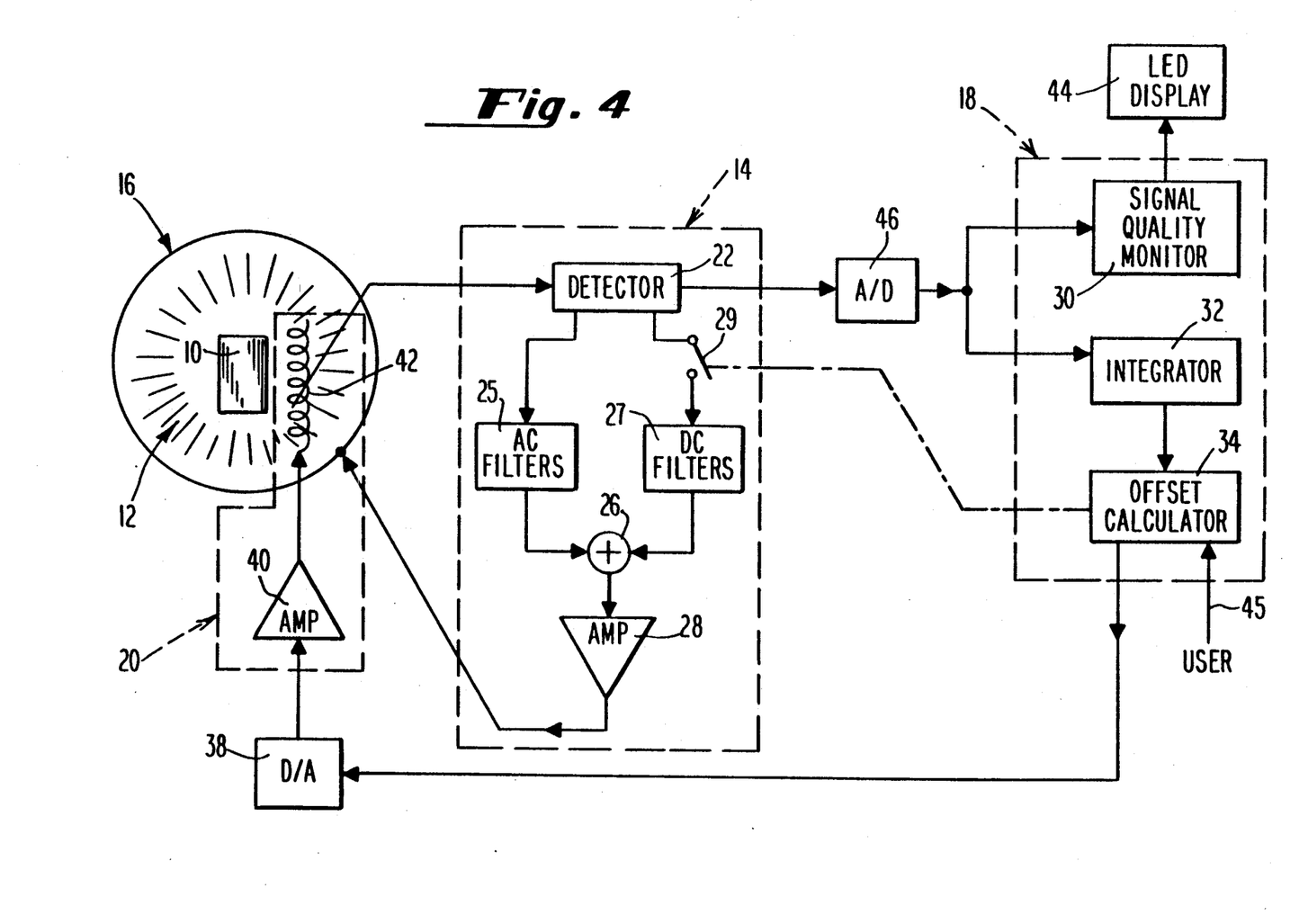
FIG. 4 is a block diagram of an alternative embodiment for the magentic compensation system of FIG. 1.

In some embodiments of the invention, it may be beneficial to remove the direct connection 36 between microprocessor 18 and the instrument 10 so that the instrument 10 is not required to provide a computer interface. Referring to FIG. 4, an alternative embodiment is provided where the offsetting magnetic field is maintained at a fixed level when the secondary magnetic field fluctuations are negligible. For example, during fine tuning of a HREM, changes in the HREM lens currents will generate insignificant fluctuations with respect to the compensation provided by the compensation system (i.e., the fluctuations are small enough so that they are not detected and neutralized as a result of the distance between the detector and the instrument).

Referring to the embodiment in FIG. 4, microprocessor 18 receives the detected instabilities via the A/D converter 46. Since there is no physical interface between the instrument 10 and the microprocessor 18, the detector 22 detects all magnetic instabilities including the secondary magnetic field instabilities when the position of the relay 29 is open (i.e., DC filters are inactive, offset calculator 34 is coupled to the integrator 32). Therefore, integrator 32 integrates all detected instabilities which may include slowly wandering DC fields, secondary magnetic fields produced by the instrument, and the field component due to the earth's constant magnetic field. The integrator 32 outputs the integrated DC field instabilities to the offset calculator 34 which calculates the offset value as described herein above.

When the user has adjusted the instrument settings, he may desire to freeze the offset value at its current value so that the compensation system can begin to neutralize the slowly wandering DC fields without opposing the secondary fields generated by instrument 10. The user may enter a command via the user interface 45 causing the offset calculator 34 to freeze the offset value at its current value and to close the relay 29, thereby coupling the detector 22 to the DC filters 27. The electromagnetic offset circuit 20 provides cancellation to the secondary magnetic fields and the earth's magnetic field at the detector 22 probe. In addition, the fixed offset will include a magnitude equal to the slowly wandering DC field at the time the offset value was fixed. During the fixed offset mode, the compensation system neutralizes both AC and slowly wandering DC detected instabilities in the same way as described for the embodiment shown in FIG. 1, except the electromagnetic offset produced by the solenoid 42 remains fixed.

Maintaining the offsetting magnetic field at a fixed level may be achieved in several ways. For example, when a user focuses the HREM for a particular experiment to a resolution requiring only additional fine tuning, the user instructs the microprocessor 18 to freeze the offset value at its current value. Maintaining the current offset value may occur for a fixed time or a time period terminated by the user. Alternatively, the commencement and termination of the fixed offset mode is triggered by DC signal threshold levels determined by the signal quality monitor 30. For instance when DC fluctuations fall below a certain threshold, the signal quality monitor 30 will either trigger the offset calculator to freeze the current offset value or will provide an indication to the LED display 44 so that the user may instruct the offset calculator 34. Accordingly, when the DC fluctuations rise above a threshold, the signal quality monitor provides the same functions, however, the result is that the offset calculator 34 resumes calculating the necessary offset value to neutralize the secondary magnetic field.

While the invention has been described and illustrated with references to specific embodiments, those skilled in the art will recognize that modification and variations may be made without departing from the spirit and scope of the invention as described hereinabove and set forth in the following claims.

What is claimed is:

1. A system for substantially neutralizing magnetic instabilities in an environment of a magnetically sensitive instrument, the instrument having adjustable controls for operating the instrument, adjustment of the controls causing the instrument to produce secondary magnetic fields in the environment of the instrument in addition to the magnetic instabilities, comprising:
   (a) detection means for detecting the magnetic instabilities in the environment of the instrument and for providing signals indicative of the detected magnetic instabilities;
   (b) electromagnetic coil means substantially surrounding the instrument, for producing at least one primary magnetic field around the instrument in response to the detected magnetic instabilities, the primary magnetic field comprising magnetic field components substantially equal in magnitude and opposite in direction to the detected magnetic instabilities;
   (c) feedback means having an input for receiving the signals indicative of the detected instabilities and an output coupled to the electromagnetic coil means for controlling the magnitude of the primary magnetic field produced in response to the detected magnetic instabilities;
   (d) offset means disposed in the environment of the instrument for producing an offsetting magnetic field for substantially neutralizing the secondary magnetic fields produced by the instrument, the offsetting magnetic field comprising magnetic field components substantially equal in magnitude and opposite in direction to the secondary magnetic fields; the detected magnetic instabilities being substantially free of any secondary magnetic field effects, the feedback means thereby controlling the magnitude of the primary magnetic field substantially free of effects of the secondary magnetic field; and
   (e) a processing means having an input coupled to the adjustable controls and an output coupled to the offset means for providing, based on adjustments of the adjustable controls, an offset value for controlling the offsetting magnetic field, the offset value having a magnitude indicative of a correction to be made of the offsetting magnetic field.

2. The system recited in claim 1, wherein the detection means is a fluxgate magnetometer.

3. The system recited in claim 1, wherein the offset means comprises:
   (a) a solenoid disposed in the environment of the instrument, for producing the offsetting magnetic field; and
   (b) a solenoid power supply having an input for receiving a signal indicative of the offset value and an output for supplying drive current to the solenoid.

4. The system of claim 1, wherein the electromagnetic coil means is a helmholtz coil.

5. The system recited in claim 1, wherein the instrument and the electromagnetic coil means each have a length and the electromagnetic coil means has a width, the length of the electromagnetic coil means being greater than the length of the instrument and the width of the electromagnetic coil means being such that the electromagnetic coil means encompasses the instrument within the periphery of the electromagnetic coil means.

6. The system recited in claim 5, wherein the electromagnetic coil means comprises at least one coil loop disposed in a plane, the plane of the coil loop being substantially perpendicular to the direction of the detected magnetic instabilities.

7. The system recited in claim 1, wherein the processing means has a second input for receiving the signals indicative of the detected magnetic instabilities, the system further comprising a warning means coupled to the processing means for providing an indication to a user of the instrument of a characteristic of the detected magnetic instabilities.

8. The system recited in claim 7, wherein said warning means is an LED display.

9. The system of claim 7, wherein the characteristic of the detected magnetic instabilities comprises at least one of:
   (a) at least one frequency associated with the detected magnetic instabilities, each frequency identifying a different magnetic field component present in the environment of the instrument; and
   (b) a signal strength of each respective magnetic field component.

10. The system recited in claim 1, wherein said feedback means comprises:
    (a) filter means having an input for receiving the signals indicative of the detected magnetic instabilities from the detection means and for filtering and amplifying said input signals to provide an output of substantially noise-free signals representing a power level to be supplied to the electromagnetic coil means; and
    (b) a power amplifier having an input for receiving the noise-free signals and an output for providing current drive to the electromagnetic coil means.

11. The system recited in claim 1, wherein the processing means is further coupled to the detection means and the feedback means and is operable to receive the signals indicative of the detected instabilities from the detection means, the processing means integrating the signals indicative of the detected magnetic instabilities and providing the signals so integrated to the feedback means.

12. The system recited in claim 11, wherein said feedback means comprises:
    (a) filter means having an input for receiving the integrated signals from the processing means and for filtering and amplifying said input signals to provide an output of substantially noise-free signals representing a power level to be supplied to the electromagnetic coil means; and
    (b) a power amplifier having an input for receiving the noise-free signals and an output for providing current to drive the electromagnetic coil means.

13. The system recited in claims 10 or 12, wherein the filter means comprises at least one adjustable gain preamplifier.

14. A method for substantially neutralizing magnetic instabilities in an environment of a magnetically sensitive instrument, the instrument having adjustable controls for operating the instrument, adjustment of the controls causing the instrument to produce secondary magnetic fields in the environment of the instrument in addition to the magnetic instabilities, the method comprising:
    (a) producing at least one primary magnetic field around the instrument;
    (b) detecting the magnetic instabilities in the instrument's environment and providing signals indicative of the detected magnetic instabilities;

(c) controlling the primary magnetic field based upon the signals indicative of the detected magnetic instabilities;

(d) monitoring the adjustable controls to determine the magnitude of the secondary magnetic fields and providing an offset value indicative of the magnitude of the secondary magnetic fields;

(e) producing an offsetting magnetic field and neutralizing the secondary magnetic fields with the offsetting magnetic field, the magnitude of the offsetting magnetic field produced being based on the offset value; and (f) controlling the magnitude of the offsetting magnetic field by adjusting the offset value to compensate for variations in the secondary magnetic fields resulting from adjustments of the adjustable controls, the detected magnitude instabilities being substantially free of effects of the secondary magnetic field.

15. The method of claim 14, further comprising:

(g) filtering the signals indicative of the detected instabilities to provide substantially noise-free signals representing an operative power level for controlling the primary magnetic field.

16. The method of claim 14, further comprising:

(g) integrating the signals indicative of the detected magnetic instabilities and providing the signals so integrated for controlling the primary magnetic field.

17. The method of claim 16, further comprising the step of filtering the signals so integrated to provide substantially noise-free signals representing an operative power level for controlling the primary magnetic field.

18. The method of claim 14, further comprising:

(g) monitoring the signals indicative of the detected instabilities for providing an output to a warning means for providing an indication to a user of the instrument of a characteristic of the detected magnetic instabilities.

19. The method of claim 18, wherein the characteristic of the detected magnetic instabilities comprises at least one of:

(a) at least one frequency associated with the detected magnetic instabilities, each frequency identifying a different magnetic field component present in the environment of the instrument; and (b) a signal strength of each respective magnetic field component.

20. A system for substantially neutralizing magnetic instabilities in an environment of a magnetically sensitive instrument, the instrument being operable to produce secondary magnetic fields in the environment of the instrument in addition to the magnetic instabilities, the system comprising:

(a) detection means for detecting both the magnetic instabilities in the environment of the instrument and the secondary magnetic fields produced by the instrument and for providing signals indicative of the combination of the detected magnetic instabilities and secondary magnetic fields;

(b) offset means interfaced with the detection means and disposed in the environment of the instrument for producing an offsetting magnetic field for substantially neutralizing the magnetic instabilities and secondary magnetic fields in response to the signals provided by the detection means, the offsetting magnetic field comprising magnetic field components substantially equal in magnitude and opposite in direction to the combination of the detected magnetic instabilities and secondary magnetic fields;

(c) a processing means having an input coupled to the detection means and an output coupled to the offset means for providing, based on the detected magnetic instabilities and secondary fields, an offset value for controlling the offsetting magnetic field, the offset value having a magnitude indicative of the combination of the detected magnetic instabilities and secondary magnetic fields;

(d) control means for causing the processing means to substantially freeze the offset value so provided, the magnitude and direction of the offsetting magnetic field remaining substantially constant while the offset value is rendered frozen by the processing means; and (e) electromagnetic coil means substantially surrounding the instrument and having one input coupled to the detection means and a second input coupled to the control means, for producing a primary magnetic field around the instrument in response to at least some of the detected magnetic instabilities, the primary magnetic field comprising magnetic field components substantially equal in magnitude and opposite in direction to at least the same detected magnetic instabilities, the electromagnetic coil means additionally producing the primary magnetic field in response to substantially all of the detected magnetic instabilities if the offset value has been rendered frozen by the processing means, the primary magnetic field substantially neutralizing the magnetic environment around the instrument.

21. The system recited in claim 20, wherein the processing means provides an updated offset value corresponding to the detected magnetic instabilities and secondary magnetic fields to the offset means based on a characteristic of the secondary magnetic fields.

22. The system recited in claim 20, wherein said warning means comprises an LED display.

23. The system recited in claim 20, wherein the detection means is a fluxgate magnetometer.

24. The system recited in claim 20, wherein the offset means comprises:

(a) a solenoid disposed in the environment of the instrument, for producing the offsetting magnetic field; and (b) a solenoid power supply having an input for receiving a signal indicative of the offset value and an output for supplying drive current to the solenoid.

25. The system of claim 20, wherein the electromagnetic coil means is a helmholtz coil.

26. The system of claim 20, further comprising a warning means coupled to the processing means for monitoring the signals indicative of the detected magnetic instabilities and for providing an indication to a user of the instrument of a characteristic of the detected magnetic instabilities and secondary magnetic fields.

27. The system of claim 26, wherein the characteristic of the detected magnetic instabilities comprises at least one of:

(a) at least one frequency associated with the detected magnetic instabilities, each frequency identifying a different magnetic field component present in the environment of the instrument; and (b) a signal strength of each respective magnetic field component.

28. The system recited in claim 20, wherein the instrument and the electromagnetic coil means each have a length and the electromagnetic coil means has a width, the length of the electromagnetic coil means being greater than the length of the instrument and the width of the electromagnetic coil means being such that the electromagnetic coil means encompasses the instrument within the periphery of the electromagnetic coil means.

29. The system recited in claim 28, wherein the electromagnetic coil means comprises at least one coil loop disposed in a plane, the plane of the coil loop being substantially perpendicular to the direction of the detected magnetic instabilities.

30. The system recited by claim 20, further comprising:
(f) feedback means having an input for receiving the signals indicative of the combination of the detected instabilities and secondary magnetic fields and having an output coupled to the electromagnetic coil means for controlling the magnitude of the primary magnetic field produced in response to the detected magnetic instabilities.

31. The system recited in claim 30, wherein the processing means provides offset values corresponding to the detected magnetic instabilities and secondary magnetic fields to the offset means based on a characteristic of the secondary magnetic fields.

32. The system recited in claim 31, wherein the magnetic instabilities comprise AC and DC magnetic field components and the secondary magnetic fields comprise DC magnetic field components, said feedback means comprising:
(a) AC filter means having an input for receiving the signals indicative of the detected magnetic instabilities and secondary magnetic fields and for filtering the AC magnetic components detected therein and for amplifying said AC magnetic components to provide an output representing a power level to be supplied to the electromagnetic coil means to stabilize the AC magnetic components, the output defining an AC output;
(b) DC filter means having an input for receiving the signals indicative of the detected magnetic instabilities and secondary magnetic fields and for filtering the DC magnetic components detected therein and for amplifying the DC magnetic components to provide an output representing a power level to be supplied to the electromagnetic coil means to stabilize the DC magnetic components, the output defining a DC output;
(c) switch means interfaced to the control means for electrically connecting the detection means to the DC filter means when the offset value is frozen by the processing means and for breaking the electrical connection when the control means causes the processing means to provide the new offset value, the DC filter means being operable to provide the DC output only when the detection means is electrically connected thereto;
(d) an adder for combining the AC output and DC output, if any, the combination resulting in a signal indicative of the magnitude of the primary magnetic field required to stabilize the detected magnetic instabilities; and
(d) a power amplifier coupled to the adder having an input for receiving the signals indicative of the magnitude of the primary magnetic field and having an output for providing current to drive the electromagnetic coil means.

33. The system recited in claim 32, wherein each of the AC filter means and DC filter means comprises at least one adjustable gain pre-amplifier.

34. A method for substantially neutralizing magnetic instabilities in an environment of a magnetically sensitive instrument, the instrument being operable to produce secondary magnetic fields in the environment of the instrument in addition to the magnetic instabilities, the method comprising the steps of:
(a) detecting both the magnetic instabilities in the environment of the instrument and the secondary magnetic fields produced by the instrument;
(b) providing signals indicative of a combination of the detected magnetic instabilities and secondary magnetic fields;
(c) producing an offsetting magnetic field for substantially neutralizing the magnetic instabilities and secondary magnetic fields in response to the signals provided, the offsetting magnetic field comprising magnetic field components substantially equal in magnitude and opposite in direction to the combination of the detected magnetic instabilities and secondary magnetic fields;
(d) providing, based on the detected magnetic instabilities and secondary fields, an offset value having a magnitude indicative of the combination of the detected magnetic instabilities and secondary magnetic fields;
(e) controlling the magnitude of the offsetting magnetic field based on the offset value so provided;
(f) substantially freezing the offset value so provided, the magnitude and direction of the offsetting magnetic field remaining substantially constant while the offset value is frozen; and
(g) producing a primary magnetic field around the instrument in response to at least some of the detected magnetic instabilities, the primary magnetic field comprising magnetic field components substantially equal in magnitude and opposite in direction to at least the same detected magnetic instabilities, and additionally producing the primary magnetic field in response to substantially all of the detected magnetic instabilities when the offset value is frozen,
whereby the primary magnetic field substantially neutralizes the magnetic environment around the instrument.

35. The method of claim 34, further comprising the steps of:
(h) monitoring the signals indicative of the detected magnetic instabilities; and
(i) providing an indication to a user of the instrument of a characteristic of the detected magnetic instabilities.

36. The method of claim 35, wherein the characteristic of the detected magnetic instabilities comprises at least one of:
(a) at least one frequency associated with the detected magnetic instabilities, each frequency identifying a different magnetic field component present in the environment of the instrument; and
(b) a signal strength of each respective magnetic field component.

37. The method of claim 34, further comprising the step of:
(h) controlling the magnitude of the primary magnetic field produced in response to the detected magnetic instabilities.

38. The method of claim 37, wherein the magnetic instabilities comprise AC and DC magnetic field components and the secondary magnetic fields comprise DC magnetic field components, and the step of controlling the magnitude of the primary magnetic field comprises the steps of:
(a) filtering the AC magnetic components so detected to provide an output to be used to produce a magnitude of the primary magnetic field to stabilize the AC magnetic components, the output defining an AC output;
(b) filtering the DC magnetic components so detected to provide an output to be used to produce a magnitude of the primary magnetic field to stabilize the DC magnetic components, the output defining a DC output;
(c) causing the DC components to be filtered when the offset value is frozen;
(d) preventing the filtering of the DC components when the new offset value is caused to be provided;
(e) combining the AC output and DC output, if any, the combination resulting in a signal indicative of the magnitude of the primary magnetic field required to stabilize the detected magnetic instabilities; and
(f) providing an output indicative of the magnitude of the primary magnetic field such that the primary magnetic field stabilizes the detected magnetic instabilities in the environment of the instrument.

39. The method of claim 37, further comprising the steps of:
(i) providing an updated new offset value based on fluctuations in the magnitude of the secondary magnetic fields.

40. The method of claim 39, wherein the steps of substantially freezing the offset value and providing the updated offset value are initiated by a user of the instrument.

41. The method of claim 39, wherein the steps of substantially freezing the offset value and causing the updated offset value to be provided, comprises:
monitoring the detected magnetic instabilities and secondary magnetic fields;
substantially freezing the offset value when the signal strengths so monitored fall below a first predetermined threshold; and
providing the updated offset value when the signal strengths so monitored exceed a second predetermined threshold.

* * * * *

UNITED STATES PATENT AND TRADEMARK OFFICE
CERTIFICATE OF CORRECTION

PATENT NO. : 5,225,999

DATED : July 6, 1993

INVENTOR(S) : David E. Luzzi and Charles D. Graham, Jr.

It is certified that error appears in the above-identified patent and that said Letters Patent is hereby corrected as shown below:

Title Page:
At [75] Inventor:, after "David E. Luzzi, Wallingford, Pa.", insert --Charles D. Graham, Jr., Ardmore, Pa.--

Signed and Sealed this

Seventeenth Day of May, 1994

*Attest:*

BRUCE LEHMAN

*Attesting Officer*     Commissioner of Patents and Trademarks